(12) United States Patent
Sasaki (10) Patent No.: US 7,231,838 B2
(45) Date of Patent: Jun. 19, 2007

(54) INDICATING INSTRUMENT AND INITIALIZING DEVICE

(75) Inventor: Kiyoshi Sasaki, Tokyo (JP)

(73) Assignee: Calsonic Kansei Corporation, Tokyo (JP)

( * ) Notice: Subject to any disclaimer, the term of this patent is extended or adjusted under 35 U.S.C. 154(b) by 134 days.

(21) Appl. No.: 11/208,887

(22) Filed: Aug. 23, 2005

(65) Prior Publication Data

US 2006/0144172 A1    Jul. 6, 2006

(30) Foreign Application Priority Data

Aug. 25, 2004   (JP)   ............... 2004-244769

(51) Int. Cl.
*G01L 3/02* (2006.01)
(52) U.S. Cl. ............................... 73/862.31
(58) Field of Classification Search ............ 73/862.31, 73/866.1, 488; 318/696; 475/337
See application file for complete search history.

(56) References Cited

U.S. PATENT DOCUMENTS

| | | | |
|---|---|---|---|
| 4,191,120 A | * | 3/1980 | Bergvall ............ 112/443 |
| 4,314,146 A | * | 2/1982 | Berney .............. 377/112 |
| 2003/0076069 A1 | | 4/2003 | Yamada et al. |
| 2006/0010977 A1 | * | 1/2006 | Baba ................. 73/488 |

FOREIGN PATENT DOCUMENTS

| | | |
|---|---|---|
| EP | 0 959 359 A1 | 11/1999 |
| EP | 1 195 610 A1 | 4/2002 |
| JP | 2000-050695 A | 2/2000 |
| JP | 2001-314099 A | 11/2001 |
| JP | 2002-250641 A | 9/2002 |

* cited by examiner

*Primary Examiner*—Jewel Thompson
(74) *Attorney, Agent, or Firm*—Foley & Lardner LLP (57) ABSTRACT

An indicating instrument includes a stepping motor, a speed-reducing gear mechanism, an indicating needle, a stopper mechanism and an initializing unit. A position which the indicating needle indicates when turned by a preset angle relative to a position which the indicating needle indicates when turning of the indicating needle is mechanically stopped with the stopper mechanism is taken as a graduation-starting position. The initializing unit is to drive the stepping motor to turn the indicating needle toward the indicating needle-stopped position; after stoppage of the turning of the needle, to drive the stepping motor to turn the needle away from the needle-stopped place where the turning of the needle is mechanically stopped with the stopper mechanism, thereby to turn the needle beyond the graduation-starting position, and thereafter to drive the stepping motor to turn the needle toward the stopper mechanism; and to return the needle to the graduation-starting position and stop the needle there.

8 Claims, 11 Drawing Sheets

INDICATING INSTRUMENT AND INITIALIZING DEVICE

BACKGROUND OF THE INVENTION

1. Field of the Invention

The present invention relates to an indicating instrument and an initializing device for transmitting a rotation output of a stepping motor to an indicating needle via a speed-reducing gear mechanism. More specifically, the invention relates to the indicating instrument and the initializing device in which a stopped position of the indicating needle at the time of turning on or off an electric source is not substantially different from that after an ordinary control is made.

The ordinary control means that the indicating needle is controlled to stop at the position of the graduation "zero" when the vehicle or the like is stopped (vehicle speed or the like=zero) during ordinary running or the like.

2. Related Art Statement

According to the indicating instrument using the stepping motor as the driving source of the indicating needle, a reference position of the indicating needle is set by turning the indicating needle toward a zero-reset position and stopping the indicating needle at the zero-resetting position with a stopper so that a zero-return correction may be performed (See JP-A 2000-50695).

When the indicating needle is moving or when a magnetic rotor of the stepping motor is being rotated, induction voltage is generated in a field coil. When the indicating needle is stopped at the zero-reset position and the rotation of the magnetic rotor is stopped, no indication voltage is produced in the field coils. Therefore, during the time period when the stepping motor is driven in the zero-resetting direction, the magnetizing coil is switched to a non-magnetized state, and it is judged that the indicating needle reached the zero-reset position when the induction voltage generated in the field coils became not more than a preset threshold value. Then, the zero-return correction operation is terminated. See JP-A 2001-314099 and JP-A 2002-250641.

In the conventional indicating instrument, the position where turning of the indicating needle is mechanically stopped with a stopper mechanism is taken as a reference position of the indicating needle, and this reference position is taken as a zero position of graduation. Feeding of AC zero-resetting signals (AC signals to driving the stepping motor in a reverse direction) is stopped at the position where the turning of the indicating needle is mechanically stopped (i.e., in a state that a member to be turned is pushed against the stopper), thereby terminating the zero-return correction operation. Accordingly, if a slight play of the gears occurs at the stop position, the position where the member to be driven should be inherently stopped may be stepped out by the play of the gears.

It may be considered that after an over zero-resetting operation is performed in which AC resetting signals are continuously fed by a preset electric angle, without stopping the AC zero-resetting signals, at the position where the turning of the indicating needle is mechanically stopped, the indicating needle is turned by a preset angle in a direction away from the position where the turning of the indicating needle is mechanically stopped. Since the indicating needle is turned by the preset angle in the direction away from the position where the turning of the indicating needle is mechanically stopped, the zero-return phenomenon due to the backlash of the gears or the like can be prevented.

However, the position where the indicating needle is stopped when the needle is turned by the preset angle in the direction away from the position where turning of the indicating needle is mechanically stopped differs from the stopped position of the indicating needle after the ordinary control (for example, vehicle speed=zero) owing to the backlash. More specifically, when the zero-return correction is effected, the stepping motor is rotated in a normal direction to turn the indicating needle to the position of the graduation "0", for example. On the other hand, in the ordinary control, the stepping motor is rotated in the reverse direction to return the indicating needle to the position of the graduation "0". Consequently, the stopped position of the indicating needle after the zero-return correction step differs from the stopped position of the needle after the ordinary control due to the backlash of the gear mechanism.

SUMMARY OF THE INVENTION

The present invention has been accomplished to solve the above problems, and is aimed at providing an indicating instrument and an initializing device in which no substantial difference occurs between the stopped position of the indicating needle after the zero-return correction step and the stopped position of the indicating needle after the ordinary control.

In order to solve the above problems, the indicating instrument according to the present invention comprising a stepping motor, a speed-reducing gear mechanism, an indicating needle to be turned by transmission of a rotary output of the stepping motor to the indicating needle via the speed-reducing gear mechanism, a stopper mechanism to mechanically stop turning of the indicating needle, and an initializing unit, wherein a position which the indicating needle indicates when the indicating needle is turned by a preset angle relative to a position which the indicating needle indicates when turning of the indicating needle is mechanically stopped with the stopper mechanism is taken as a graduation-starting position and wherein said the initializing unit is configured to drive the stepping motor in such a direction that the indicating needle may turn toward the position where turning of the indicating needle is mechanically stopped with the stopper mechanism; after the turning of the indicating needle is mechanically stopped with the stopper mechanism, to drive the stepping motor in such a direction that the indicating needle may turn away from the place where the turning of the indicating needle is mechanically stopped with the stopper mechanism, thereby to turn the indicating needle beyond the graduation-starting position, and thereafter to drive the stepping motor in such a direction that the indicating needle may turn toward the stopper mechanism; and return the indicating needle to the graduation-starting position and stop the indicating needle there.

The initialization-driving device for initializing an indicating position of an indicating needle of an indicating instrument according to the present invention, said indicating instrument comprising a stepping motor, a speed-reducing gear mechanism, said indicating needle to be turned by transmission of a rotary output of the stepping motor to the indicating needle via the speed-reducing gear mechanism, and a stopper mechanism to mechanically stop turning of the indicating needle, wherein a position which the indicating needle indicates when the indicating needle is turned by a preset angle relative to a position which the indicating needle indicates when turning of the indicating needle is mechanically stopped with the stopper mechanism is taken as a graduation-starting position, said initializing device being configured to initializing the indicating position of the indicating needle by (1) driving the stepping motor in such a direction that a turning direction of the indicating needle which is to be turned via the speed-reducing gear mechanism while interlocking with a rotary motion of the stepping motor may turn toward a position where turning of the indicating needle is mechanically stopped with the stopper mechanism; after the turning of the indicating needle is mechanically stopped with the stopper mechanism, (2) driving the stepping motor in such a direction that the indicating needle may turn, by a first angle, away from the place where the turning of the indicating needle is mechanically stopped with the stopper mechanism, thereby to turn the indicating needle beyond the graduation-starting position, and thereafter (3) driving the stepping motor in such a direction that the indicating needle may turn, by a second angle smaller than the first one, toward the position where the turning of the indicating needle is mechanically stopped with the stopper mechanism.

Since the rotating direction of the stepping motor when the indicating needle is stopped at the graduation-starting position in a zero-return correction step at the time of turning on or off a power source is in coincidence with the rotating direction of the stopping motor in returning the indicating needle to the graduation-starting position in the ordinary controlling, influence of the backlash can be removed. Thereby, the stopped position of the indicating needle after the zero-return correction step can be made identical with that of the indicating needle after the ordinary controlling.

This application is based on Japanese patent application No. 2004-244769 filed on Aug. 25, 2004, which is incorporated herein by reference.

BRIEF DESCRIPTION OF THE DRAWINGS

For a better understanding of the invention, reference is made to the drawings, wherein.

DETAILED DESCRIPTION OF A BEST MODE OF THE INVENTION

In the following, the best mode of the present invention will be explained based on a specific example.

Figure 1:
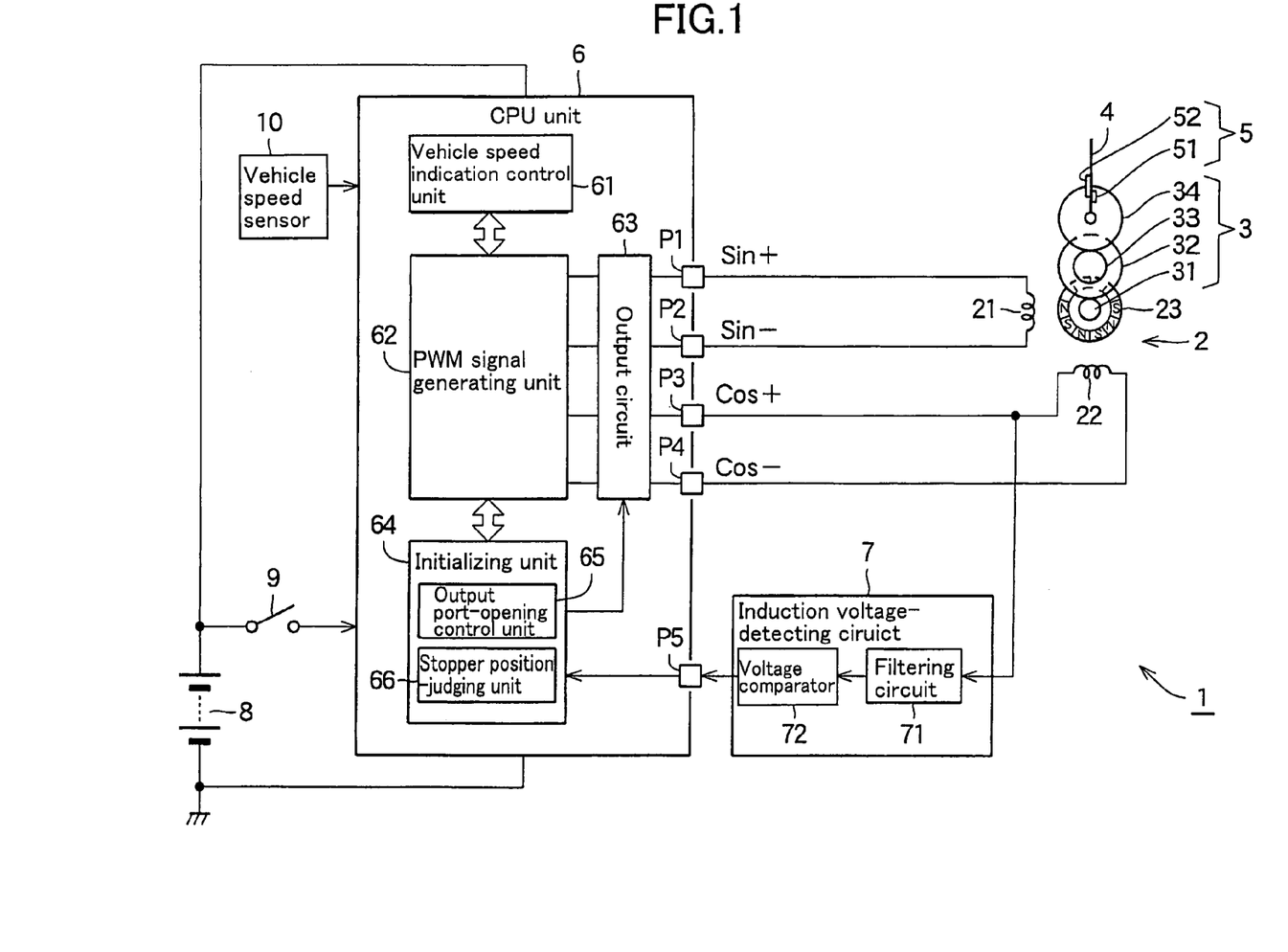
FIG. 1 is a schematic structure and a block diagram of an indicating instrument equipped with an initializing device according to the present invention.

FIG. 1 is a schematic structure and a block diagram of an indicating instrument equipped with an initializing device according to the present invention. In this embodiment, a speed meter will be explained as an indicating instrument. The indicating instrument 1 comprises a two-phase type stepping motor 2, a speed-reducing gear mechanism 3, an indicating needle 4 to be turned by the stepping motor 2 via the speed-reducing gear mechanism 3, a stopper mechanism 5 to stop turning of the indicating needle 4, a CPU 6 and an induction voltage-detecting circuit 7. The indicating instrument 1 operates upon receipt of electric power fed from a battery 8. The CPU 6 includes a power source circuit, etc. The CPU 6 drives the stepping motor 2 based on a detection output from a vehicle speed sensor 10 when an ignition switch 9 is turned on, and thereby turns the indicating needle 4 to a graduation position corresponding to the vehicle speed of a graduated disc not shown. A stepping motor unit (indicating needle-driving unit) is constituted by the stepping motor 2, the speed-reducing gear mechanism 3, and the stopper mechanism 5.

The stepping motor 2 includes a stator (not shown) with an S-phase coil (exciting coil) 21 and a C-phase coil (exciting coil) 22, and a magnet rotor (rotor) 23. A number (10 poles) of N-poles and S-poles are alternatively arranged at an outer peripheral face of the magnet rotor 23.

The speed-reducing gear mechanism 3 includes an input stage gear 31, a first intermediate gear 32, a second intermediate gear 33 and an output stage gear 34. Rotation of the magnet rotor 23 is transmitted to the input stage gear 31, and further to the output stage gear 34 via the intermediate gears 32 and 33. The indicating needle 4 is turned with rotation of the output stage gear 34.

The stopper mechanism 5 is constituted by a stopper member 51 and a stop arm 52. The stopper member 51 is attached to the output stage gear 34. When the stopper member 51 contacts the stop arm 52, the stop member 52 prevents the indicating needle 4 from being further turned in a zero-resetting direction. The stopper mechanism 5 may have such a construction that a projection is formed on a graduated disc not shown, and the indicating needle 4 is prevented from being turned in the zero-resetting direction when the indicating needle 4 contacts that projection. The gears 31 to 34 and the magnet rotor 23 are also prevented from rotating in the state that the stopper mechanism 5 prevents the indicating needle 4 from being turned in the zero-resetting direction.

In the indicating instrument 1, a graduation-starting position is set at a position which the indicating needle 4 indicates when the indicating needle 4 is turned by a preset angle relative to a position which the indicating needle 4 indicates when turning of the indicating needle 4 is mechanically stopped with the stopper mechanism 5. That is, the position which the indicating needle indicates when turning of the indicating needle is stopped by the stopper mechanism 5 is not a graduation position corresponding to "vehicle speed=0", but the position of the indicating needle 4 moved by the preset angle (for example, 1 degree) from the position which the indicating needle indicates when turning of the needle is stopped with the stopper mechanism 5 is taken as the graduation position corresponding to "vehicle speed=0". The graduated disk of the indicating instrument 1 is provided with scale marks by taking, as the graduation-starting position, the position which the indicating needle indicates when the indicating needle is turned by the preset angle relative to the position which the indicating needle indicates when the turning of the indicating needle is stopped with the stopper mechanism.

The CPU 6 is constituted by using a micro computer system. The CPU 6 includes a vehicle speed indication control unit 61, a PWM signal generating unit 62, a PWM signal outputting circuit 63, an initializing unit (zero-resetting unit) 64 for controlling the zero-return correction operation, etc. An initialization-driving device is constituted by the CPU 6 excluding the vehicle speed indication control unit 61.

When the ignition switch 9 is turned on, the vehicle speed indication controller 61 calculates a turning direction and a turning angle of the indicating needle 4 based on the vehicle speed signals fed from the vehicle sensor 10, drives the stepping motor 2 via the PWM signal generator 62, and turns the indicating needle 4 to a graduated position of the graduated disc (not shown) corresponding to a vehicle speed.

The PWM signal generator 62 generates pseudosinusoidal wave PWM signals to be fed to opposite ends of the S-phase coil 21 and pseudocosine wave PWM signals to be fed to opposite ends of the C-phase coil 22. Four kinds of the PWM signals generated by the PWM signal generator 62 are fed to output ports P1 to P4 via the outputting circuit 63, respectively.

The outputting circuit 63 includes a plurality of circuits for the output ports P1 to P4, respectively. In each of the circuit, a first switching element such as a transistor for outputting a high-level (level of power source voltage) voltage and a second switching element such as a transistor for outputting a ground-level voltage are connected in series. The outputting circuit 63 keeps open the output port (high impedance) by setting each of the switching elements to a turn-off state.

In this embodiment, a PWM signal Sin+ is outputted on a "Sin+" side from the output port P1, and is fed to one side of the S-phase coil 21. A PWM signal Sin− is outputted on a "Sin−" side from the output port P2, and is fed to the other side of the S-phase coil 21. A PWM signal Cos+ is outputted on a "Cos+" side from the output port P3, and is fed to one side of the C-phase coil 22. A PWM signal Cos− is outputted on a "Con−" side from the output port P4, and is fed to the other side of the S-phase coil 22.

The initializing unit (zero-resetting unit) 64 resets the indicating needle 4 to the graduation "zero" (reference) position (zero-return correction) if the ignition switch 9 is turned off or on and if the battery 8 is connected. The initializing unit (zero-resetting unit) 64 includes an output port-opening control unit 65 and a stopper position-judging unit 66. The output port-opening control unit 65 controls one end of the C-phase coil 22 to an opened state. The stopper position-judging unit 66 detects that the rotation of the magnet rotor 23 is stopped based on an output from the induction voltage-detecting circuit 7, and thereby judges that the indicating needle 4 is returned to the stopper position.

The induction voltage-detecting circuit 7 includes a filter circuit 71 and a voltage comparator 72. The filter circuit 71 has a lowpass characteristic for reducing or removing a high-frequency noise component superimposed upon the induction voltage induced in the C-phase coil 22. The voltage comparator 72 compares the induction voltage with a preset threshold voltage, and generates binary outputs. The binary outputs from the voltage comparator 72 are fed to the initializing unit (zero-resetting unit) 64 inside the CPU 6 via an input port P5.

Figure 2:
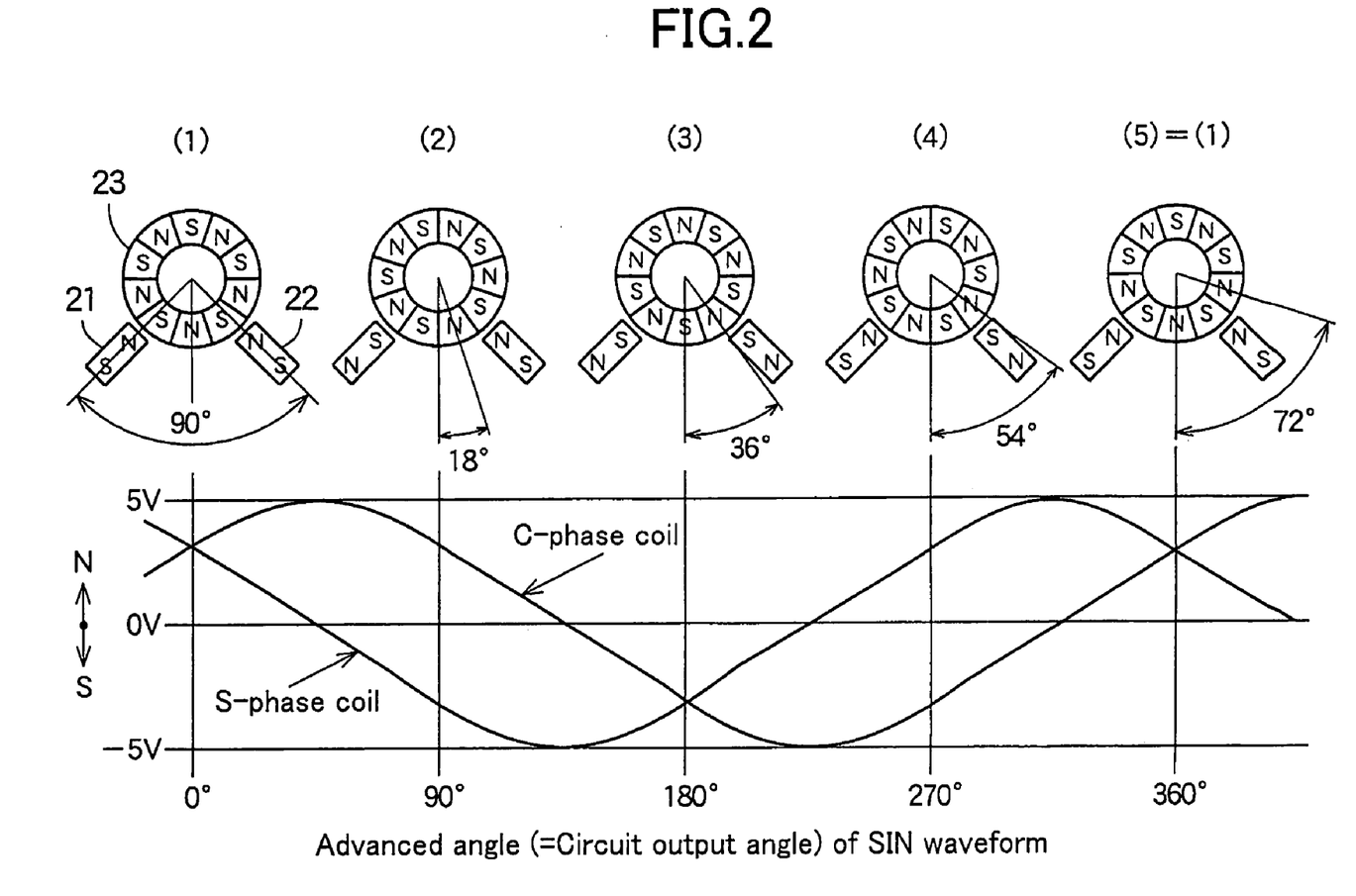
FIG. 2 is a diagram showing a driving principle of a stepping motor.

FIG. 2 shows the driving principle of the stepping motor. Two coils 21 and 22 are arranged at an angular interval of 90 degrees around the magnet rotor 23 in which 10 poles are magnetized at an identical interval. When SIN waveform voltages phase-staggered by 90 degrees are applied to the coils 21 and 22, respectively, an electric current flowing each of the coils 21 and 22 changes (resistances of the coils being identical with each other), and the magnet rotor 23 rotates depending upon changes in the magnetic fields generated on the side of the magnet rotor 23. As shown in (1) to (5) of FIG. 2, the magnet rotor 23 rotates by 72 degrees for one SIN waveform cycle (1 cycle of the circuit output).

Figure 3:
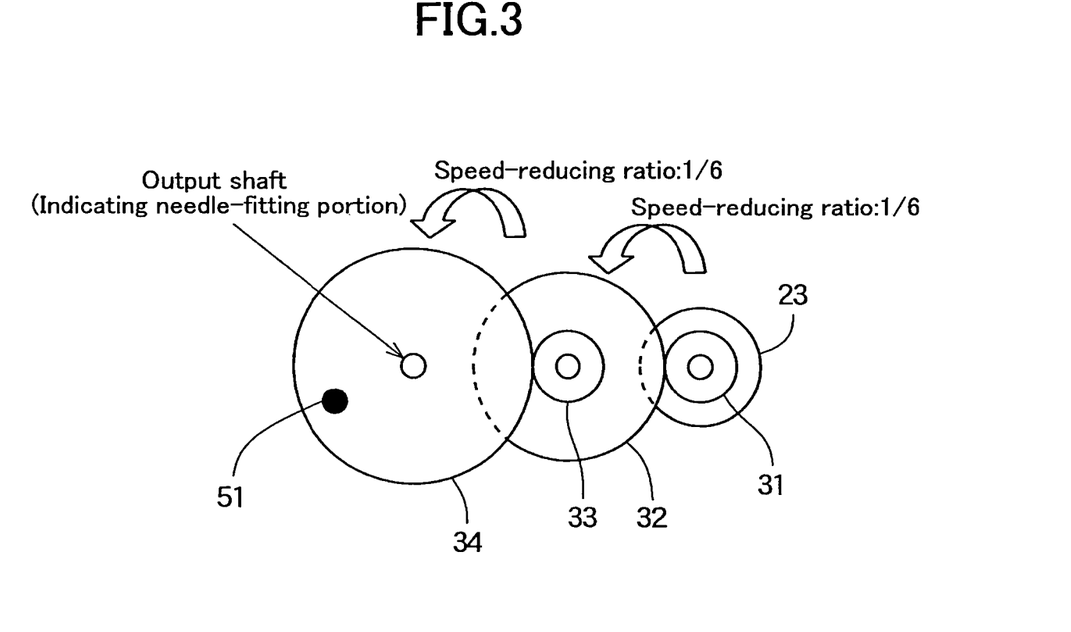
FIG. 3 is a schematic view showing a motion of a speed-reducing gear mechanism.

FIG. 3 shows the motion of the speed-reducing gear mechanism. The speed reduction ratio between the input-stage gear 31 and the first intermediate gear 32 is 1/6, that between the second intermediate gear 33 and the output-stage gear 34 is 1/6, and the entire speed reduction ratio is 1/36. Therefore, when the magnet rotor 23 rotates by 72 degrees, the indicating needle is turned by 2 degrees.

Figure 4:
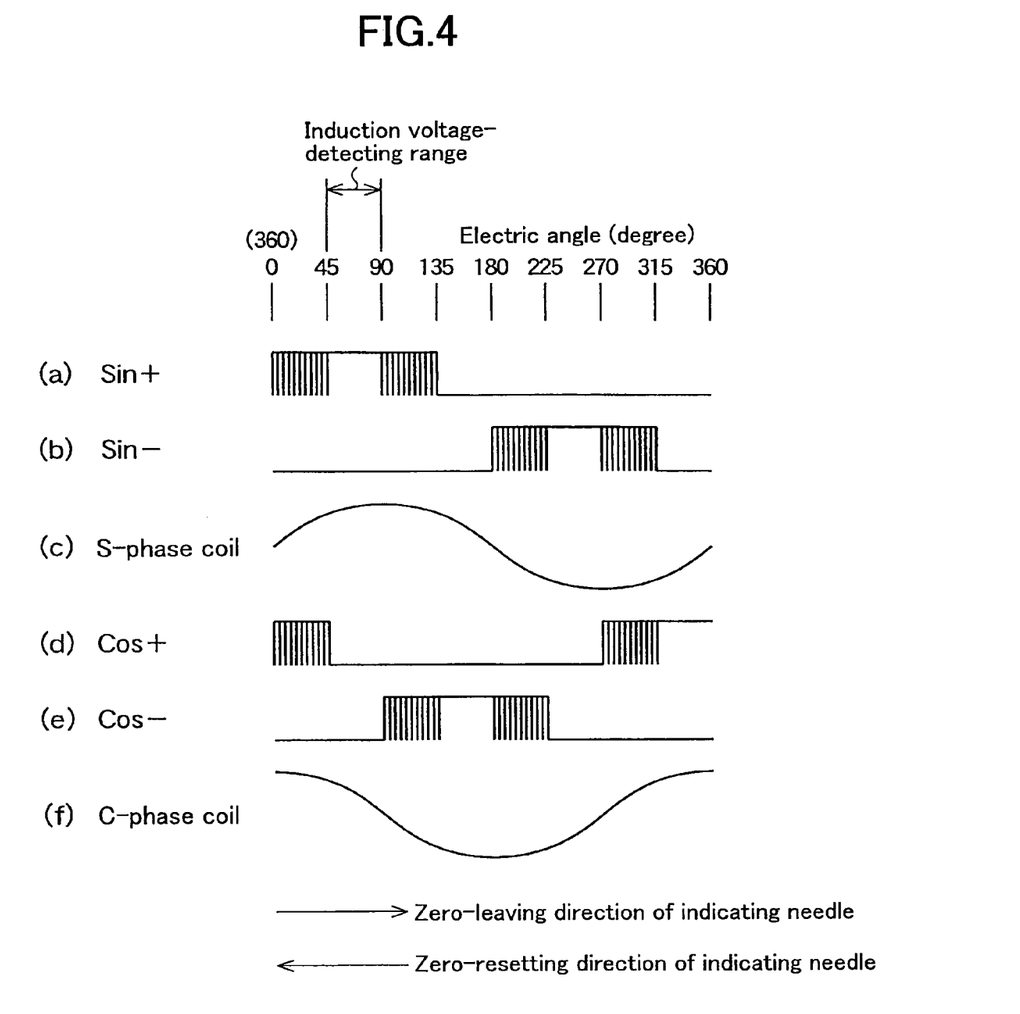
FIG. 4 is a schematic view of PWM signals.

FIG. 4 shows the PWM signals in which (a) shows the PWM signals Sin+ on the "Sin+" side, (b) shows the PWM signals Sin− on the "Sin−" side and (c) shows signals applied to the S-phase coil. Further, (d) shows the PWM signals Cos+ on the "Cos+" side, (e) shows the PWM signals Cos− on the "Cos−" side and (f) shows signals applied to the C-phase coil.

In this embodiment, three stages: a period with a duty ratio of 0 percent (L-level period), a period with a duty ratio of 50 percents (pulsated period) and a period with a duty ratio of 100 percents (H-level period) are used, so that almost sinusoidal waveform signals are fed to the S-phase coil 21, whereas almost cosine waveform signals are fed to the C-phase coil 22.

When the indicating needle 4 is to be turned reversely to the zero-resetting direction, the PWM signals are generated and outputted in a direction of increasing the electric angle shown in FIG. 4. On the other hand, when the indicating needle 4 is to be turned in the zero-resetting direction, the PWM signals are generated and outputted in a direction of decreasing the electric angle shown in FIG. 4. In the illustrated embodiment, the electric angle of 360 degrees corresponds to 2 degrees in the turning angle of the indicating needle. The relationship between the electric angle and the turning angle of the indicating needle is determined based on the stepping angle and the driving way of the stepping motor and the speed reduction ratio of the speed-reducing gear mechanism.

In the present embodiment, the induction voltage is detected during the period when the PWM signals Cos+ and Cos− on the C-phase side are both in the L-level (ground level), that is, in an electric angle range between 45 degrees and 90 degrees as shown in FIG. 4. More specifically, the induction voltage is detected in an electric angle range of 90 degrees to 67.5 degrees as shown in FIG. 4.

The output port opening controller 65 shown in FIG. 1 controls the output port P3 for outputting the PWM signals Cos+ at the point of time, to a high-impedance level, when the electric angle shown in FIG. 4 reaches 90 degrees. Thereby, one end of the C-phase coil 22 is opened. If the magnet rotor 23 is rotated, the magnetic flux changes depending upon the rotating speed thereof. Consequently, the induction voltage is generated in the C-phase coil 22 depending upon changes in the magnetic flux.

Figure 5:
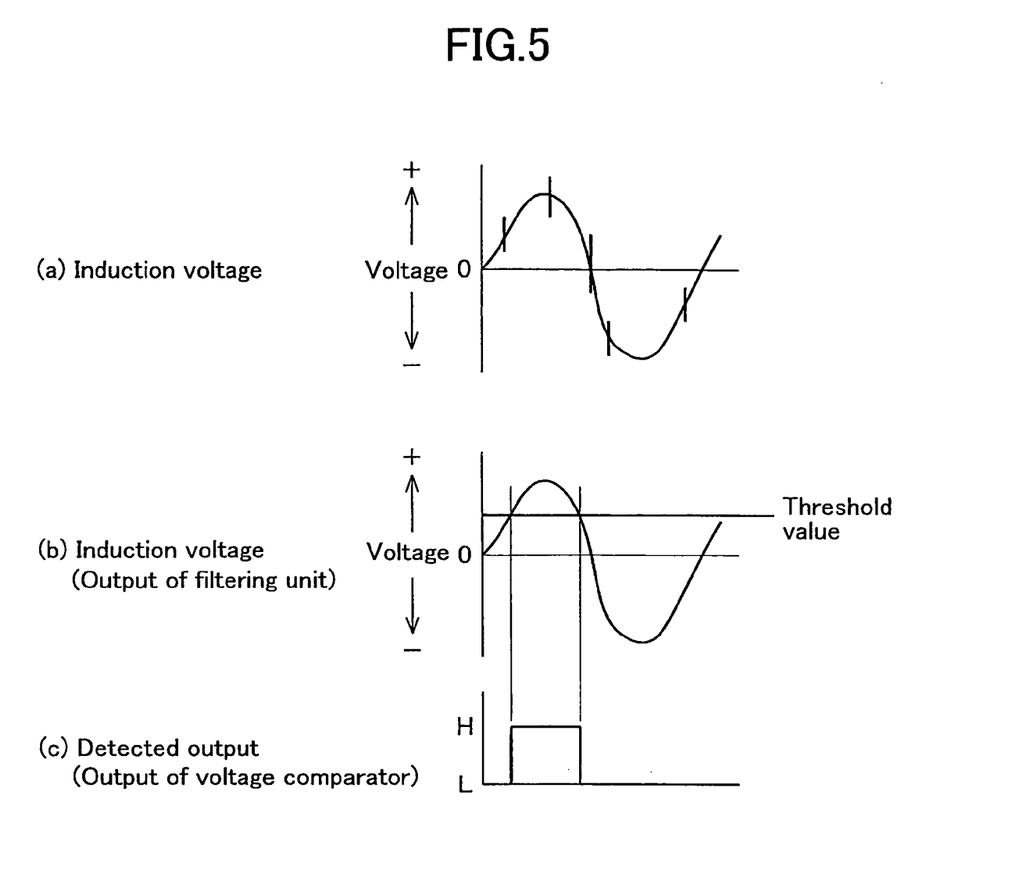
FIGS. 5(a) to 5(c) are diagrams explaining operations of an induction voltage-detecting circuit.

FIGS. 5(*a*) to 5(*c*) illustrate operation of the induction voltage detecting circuit, wherein FIG. 5(*a*) gives a waveform of the induction voltage generated in the C-phase coil 22, (b) gives an output of the filter circuit 71, and (c) gives an output of the voltage comparator 72. As shown in FIG. 5(*a*), high-frequency noise may be superimposed upon the induction voltage. The voltage comparator 72 compares the preset threshold voltage with the induction voltage from which noise is removed as shown in FIG. 5(b), and generates an output of the H level during when the induction voltage exceeds the threshold voltage.

Figure 6:
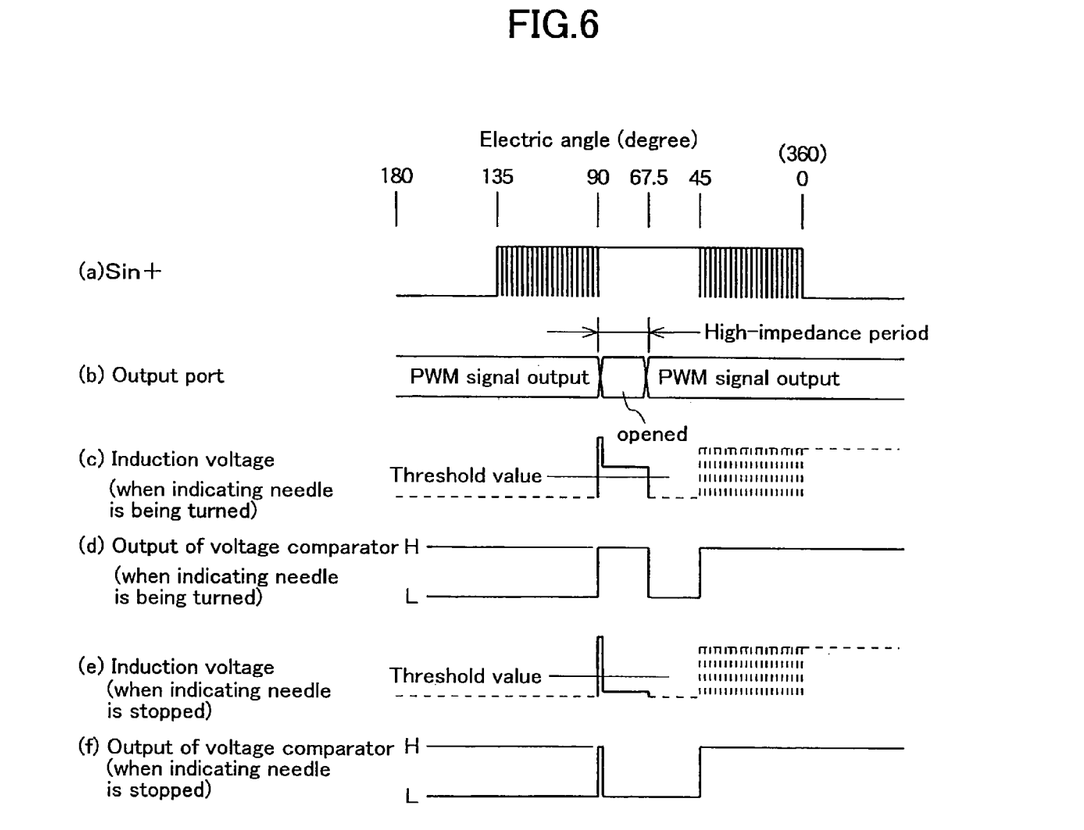
FIG. 6 is a timing chart in detecting the induction voltage.

FIG. 6 is a timing chart in detecting the induction voltage, wherein (a) shows the PWM signal Sin+ on the "S-phase side", (b) shows the opened period of the output port P3, (c) shows the induction voltage when the indicating needle is being turned, (d) shows the output of the voltage comparator during when the indicator is being turned, (e) shows the induction voltage when the indicating needle is stopped, and (f) shows the output of the voltage comparator when the indicating needle is stopped.

When the stepping motor 2 is driven to turn the indicating needle 4 in the zero-reset direction and the output port P3 is set at a high impedance state between 90 degrees and 67.5 degrees, one end of the C-phase coil 22 is opened. In this embodiment, since the indicating needle is driven at a rate of 2 mm seconds for the electric angle of 45 degrees during the time when the indicating needle is being reset to zero, the time period during when the output port P3 is converted to a high impedance is 1 mm second.

In (c) and (e) of FIG. 6, a dotted line shows PWM signals Cos+ on the C-phase side, and a solid line shows the induction voltage. A transition voltage may be temporarily generated in the C-phase coil 22, following opening of the output port P3. Thereafter, the induction voltage is generated corresponding to change in magnetic field, following to the rotation of the magnet rotor 23. As shown in (c) of FIG. 6, when the magnet rotor 23 is being turned and the indicating needle is being reset to zero, the induction voltage is generated depending upon changes in the magnetic flux, and the induction voltage exceeds the preset threshold value. As shown in (d) of FIG. 6, the output of the voltage comparator 72 becomes the High level.

The stopper position-judging unit 66 shown in FIG. 1 takes in the output of the voltage comparator 72 at a timing immediately before the opening of the output port P3 is terminated. The stopper position-judging unit 66 may take in outputs of the voltage comparator 72 at plural times at a preset time interval at a latter half of the opened period of the output port P3. When the output of the voltage comparator 72 is in the high level, the stopper position-judging unit 66 judges that the indicating needle 4 is being turned, and continues the zero-resetting operation.

No change occurs in the magnetic flux in the state that the turning of the indicating needle is stopped with the stopper mechanism 5 and the rotation of the magnet rotor 23 is also stopped. Therefore, as shown in (e) of FIG. 6, no induction voltage is generated, and thus the output of the voltage comparator 72 becomes an L level as shown in (f) of FIG. 6.

The stopper position-judging unit 66 shown in FIG. 1 takes in the output of the voltage comparator 72 at a timing immediately before the opening of the output port P3 is terminated. When the output of the voltage comparator 72 is in the low level, the stopper position-judging unit 66 judges that the indicating needle 4 is reset to the position of the stopper, and stops the driving of the stepping motor 2.

Figure 7:
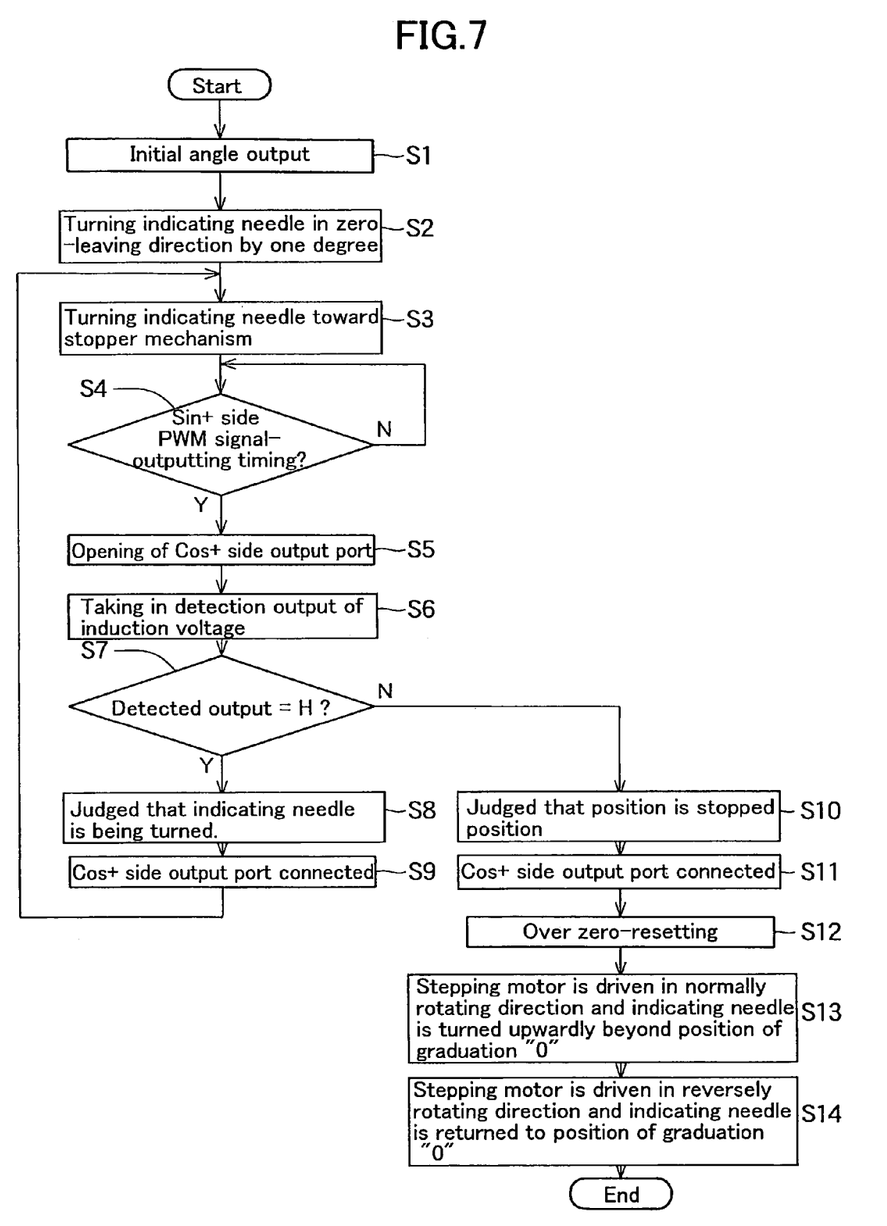
FIG. 7 is a flow chart of zero-resetting (zero-return correction).

FIG. 7 is a flow chart of the zero-resetting operation (zero-return correction). The initializing unit (zero-resetting unit) 64 outputs PWM signals (stepping motor-driving signals) for an initial angle via the PWM signal generator 62 over a preset time period (Step S1). Next, the zero-resetting unit 64 drives the stepping motor 2 in a direction of moving the indicating needle away from the zero-reset position, thereby turning up the indicating needle by 1 degree (Step S2). Then, the zero-resetting unit 64 drives the stepping motor 2 in a direction of zero-resetting the indicating needle 4 (a direction toward the stopper mechanism) (Step S3).

The output port P3 on the "Cos+" side is opened (in a high impedance state) at a timing when the PWM signal on the "Sin+" side is outputted (Steps S4, S5). The stopper position-judging unit 66 takes in the detected output (output of the voltage comparator 72) of the induction voltage from the input port P5 (Step S6). If its logic level is a H level, it is judged that the indicating needle is being turned (Steps S7 and 8), and the output port P3 on the "Cos+" side is returned to the output state of the PWM signal (Step S9), and the zero-resetting movement of the indicating needle is continued. If the detected output of the induction voltage (output of the voltage comparator 72) at Step S7 is at the H level, it is judged that the indicating needle reaches the position of the stopper (Step S10), and the output port P3 on the "Cos+" side is returned to the outputting state of the PWM signal (Step S11). Then, the zero-resetting unit 64 exercises the over zero-resetting step (Step S12). In this over zero-resetting step, AC zero-resetting signals (AC signals for driving the stepping motor 2 in the direction of zero-resetting the indicating needle 4 (the direction toward the stopper mechanism) over the electric angle of 360 degrees ($2\pi$)

After the termination of the over zero-resetting step, the initializing unit (zero-resetting unit) 64 drives the stepping motor 2 in the direction of turning the indicating needle 4 apart from the position of the stopper (normally turning direction), so that the indicating needle 4 is turned upwardly beyond the graduation "0" (Step S13). Then, the stepping motor 2 is driven in the direction of moving the indicating needle 2 toward the position of the stopper (reversely turning direction), so that the indicating position of the indicating needle 4 returns to the position of the graduation "0" (Step S14).

In Step S13, the angle by which the indicating needle 4 is turned upwardly beyond the graduation "0" is at least a play angle of the indicating needle 4 caused by the backlash. In Step S 14, the stepping motor is driven in the reverse direction by the angle by which the indicating needle 4 is turned upwardly beyond the graduation "0", and the stopped position of the indicating needle at this time is taken as the initial value (graduation "0"-indicating position). Thereby, any deviation between the stopped position of the indicating needle after the ordinary control (the indicated position at the vehicle speed "0") and the stopped position of the indicating needle after the zero-return correction can be removed. That is, since the indicating needle 4 is reset and then stopped from the same direction every time, so that any influence due to the backlash can be removed.

In Step S13, it may be that the indicating needle 4 located at the position of the stopper is turned in the normal direction by a preset angle (1 degree, for example) to indicate the graduation "0" position, and then the indicating needle 4 is turned upwardly beyond the graduation "0".

Figure 8:
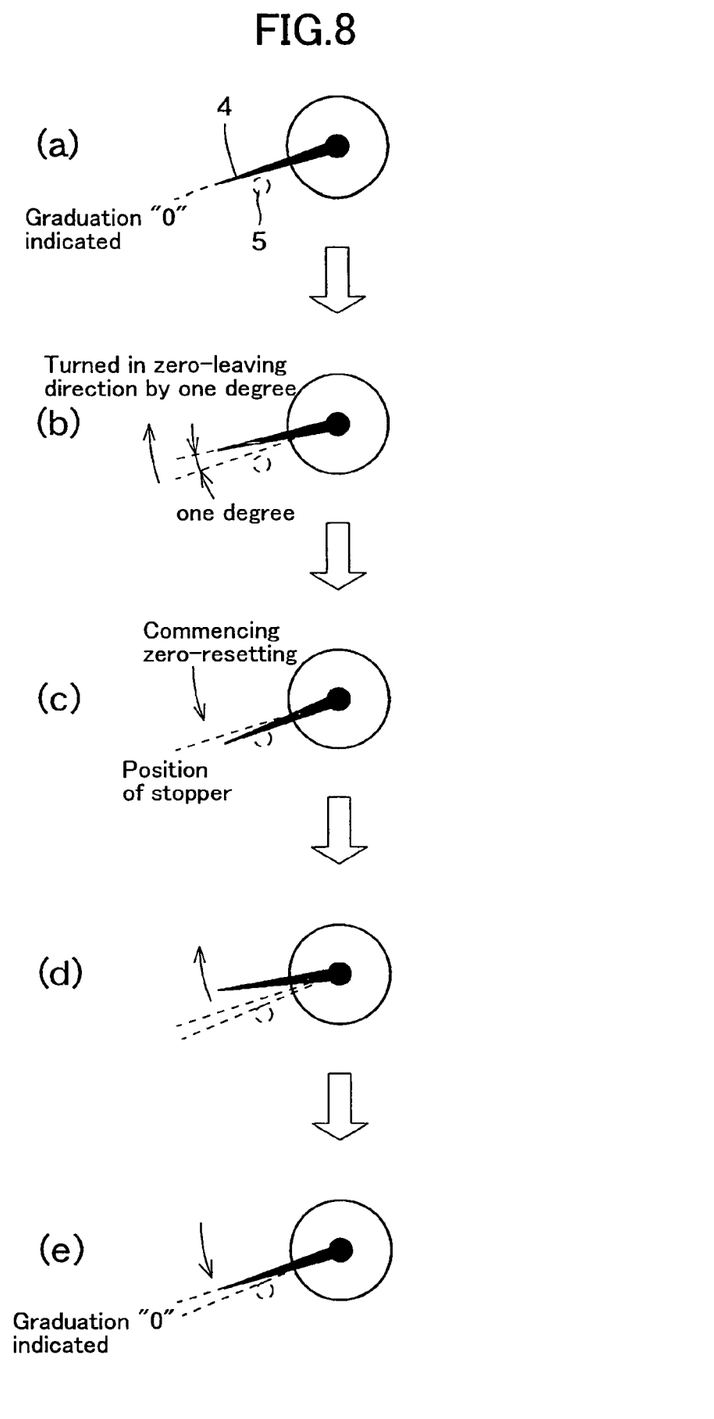
FIGS. 8(a) to 8(e) are views showing movements of an indicating needle in zero-resetting (zero-return correction).

FIGS. 8(a) to 8(e) shows motions of the indicating needle at the time of the zero-resetting operation (zero-return correction operation). FIG. 8(a) shows the position of the indicating needle 4 before commencing the zero-resetting operation. FIGS. 8(a) to 8(e) show a case where the indicating needle 4 is subjected to the zero-return correction from the state where the indicating needle 4 indicates the graduation "0". When the zero-resetting operation is commenced, as shown in FIG. 8(b), the indicating needle 4 is turned up to the direction apart from the zero-reset diction by one degree. Thereafter, as shown in FIG. 8(c), the indicating needle 4 is turned in the zero-resetting direction (the direction toward the stopper). Then, when it is detected that the turning of the indicating needle 4 (rotation of the stepping motor) in the zero-resetting direction is stopped by the stopper mechanism 5, the over zero-resetting operation is performed. When the over zero-resetting operation is completed, as shown in FIG. 8(d), the indicating needle 4 is turned upwardly beyond the graduation "0". Then, as shown in FIG. 8(e), the indicating needle 4 is returned to the graduation "0". Thereby, the indicating needle 4 indicates the position of that graduation of the graduated disk which corresponds to the vehicle speed "0".

Figure 9:
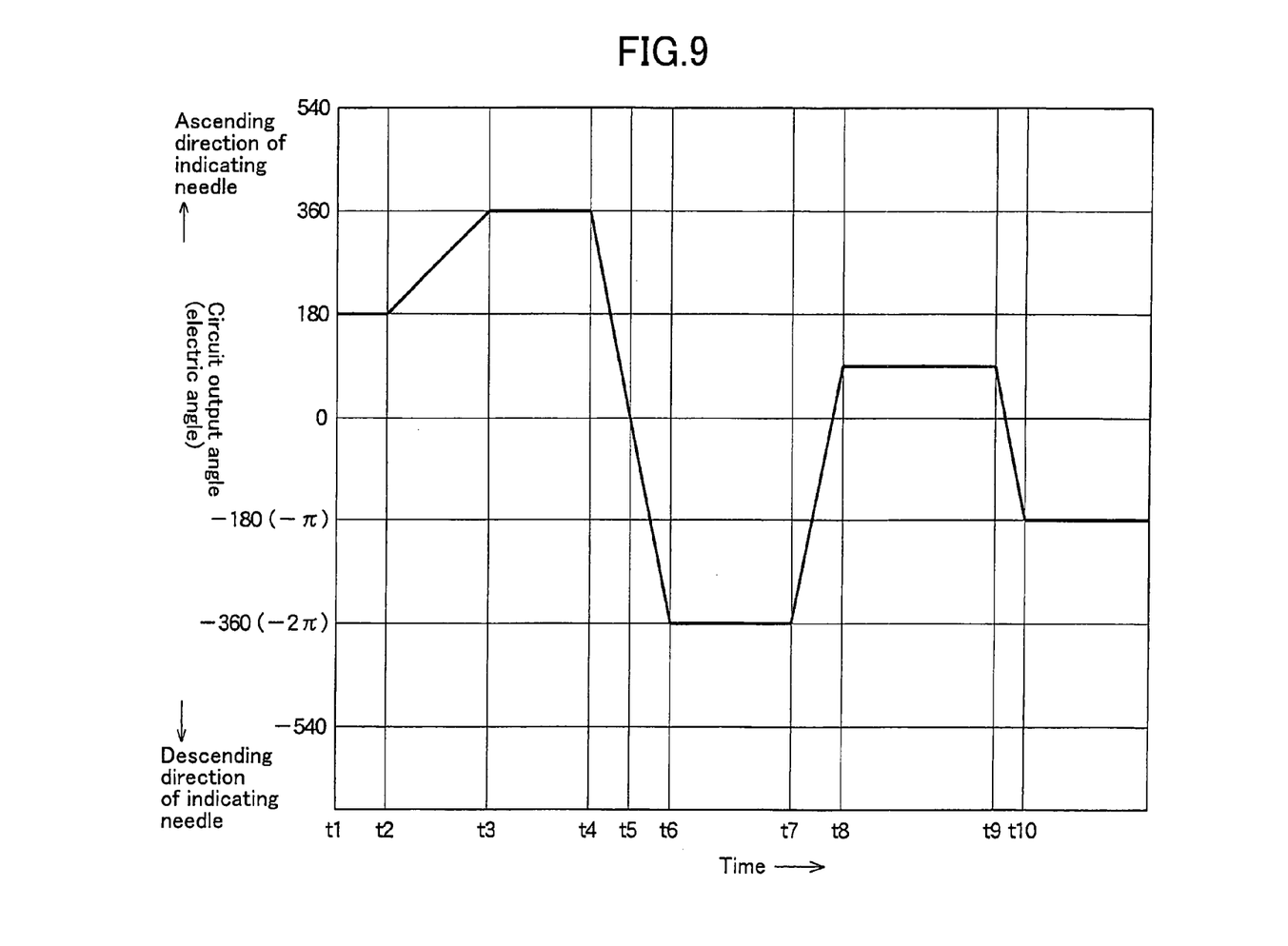
FIG. 9 is a diagram illustrating driving signals of the stepping motor in zero-resetting (zero-return correction).

FIG. 9 is a diagram explaining driving signals of the stepping motor in the zero-resetting operation (zero-return correction operation). In FIG. 9, the abscissa gives time, and the ordinate does the electric angle (circuit output angle) of the driving signals of the stepping motor. In FIG. 9, the "0" degree is set for the electric angle (circuit output angle) when the turning of the indicating needle is stopped with the stopper. In this embodiment, the position in which the indicating needle points the graduation "0" is taken as the initial output angle so that the initial output angle at the time of commencing the zero-return correction operation may be positionally identical with the circuit output angle when the processing is terminated. Consequently, even after the indicating needle contacts the stopper, AC zero-resetting signals are continuously fed. Following the over zero-resetting operation, the stepping motor is driven in the normally rotating direction so that the indicating needle may be turned upwardly beyond the position of the graduation "0", and then the stepping motor is rotated in the reverse direction so that the indicating needle may be returned to the position of the graduation "0".

More specifically, after driving signals of the stepping motor corresponding to an electric angle of 180 degrees, for example, are outputted as the initial output angle at the time of commencing the zero-return correction operation (point of time, t1), this state is held for a preset time period. Then, the stepping motor is driven during a time period from the point of time t2 to the point of time t3 such that the indicating needle may be turned up by one degree. From the point of time t4, the indicating needle 4 is turned in the direction toward the stopper mechanism. Then, when it is detected at the point of time t5 that the turning of the indicating needle 4 is stopped with the stopper mechanism 5, driving signals (AC zero-reset signals) corresponding to the electric angle 360 degrees (2π) is outputted from the detected point of time to perform the over zero-resetting. The electric angle at the time of the termination of the over zero-resetting is held during the time period from the point of time t6 to the point of time t7, and the stepping motor is driven so that the indicating needle 4 may be turned up by 2.5 degrees during the time period from the point of time t7 to the point of time 8. This output state is held until the point of time t9. By this, the indicating needle points a portion higher than the position of the graduation "0" by 1.5 degrees. Thereafter, the stepping motor is driven such that the indicating needle 4 may be turned down by 1.5 degrees during the time period from the point of time t9 to the point of time t10. As a result, the indicating needle 4 can be returned to the position of the graduation "0" through being turned in the reverse direction (in the zero-reset direction).

Since the rotating direction of the stepping motor when the indicating needle is stopped at the position of the graduation "zero" in the zero-return correction step at the time of turning on or off the power source or the like is in coincidence with the rotating direction of the stepping motor in returning the indicating needle to the graduation-starting position in the ordinary controlling, influence of the backlash can be removed.

In the above embodiment, the indicating needle 4 is zero-reset after it is turned in the direction apart from the "0" position by one degree. The angle by which the indicating needle 4 is turned to the direction apart from the zero position before commencing the zero-reset operation can be set at an appropriate angle corresponding to the stepping angle of the stepping motor or the driving system of the stepping motor or the like. Further, the indicating needle may be zero-reset without being turned in the direction apart from the zero position.

In this embodiment, the C-phase coil 22 is utilized as the induction voltage detecting coil in the state that one end of the C-phase coil 22 is opened. However, it may be that while one end of the S-phase coil 21 is opened, the induction voltage is detected with the other of the S-phase. In this case, the one end of the S-phase coil 21 is opened at a timing when the S-phase coil 21 is in a non-exited state. Thereby, whether the indicating needle 4 is being turned or in a stopped state by detecting the induction voltage, without influencing the driving of the stepping motor 2.

Figure 10:
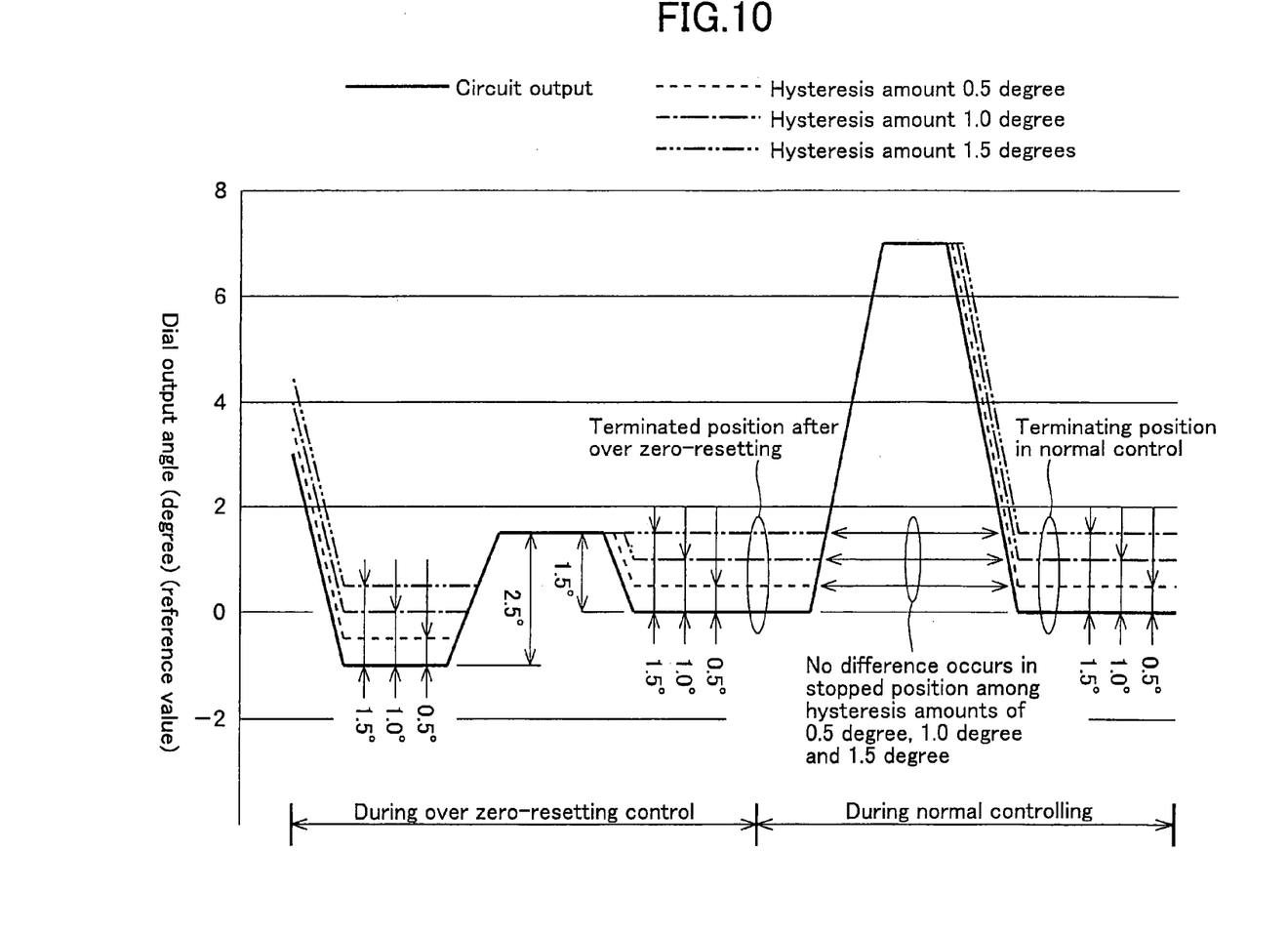
FIG. 10 is a diagram illustrating the movements of the indicating needle of the indicating instrument according to the present invention.

FIG. 10 is a diagram showing the motion of the indicating needle of the indicating instrument according to the present invention. In any of hysteresis amounts (backlash amounts): 0.5 degree, 1.0 degree and 1.5 degrees, no difference occurs between the stopped position of the indicating needle (terminated position after the over zero-resetting) when the indicating needle 4 is turned in the normally turning (turned up) direction from the position of the stopper by 2.5 degrees and then in the reversely turning (turned down) direction by 1.5 degrees and the stopped position of the indicating needle (the terminated position at the time of the normal control) when the indicating needle is returned to the position of the graduation "0" in the normal controlling during the running or the like.

Figure 11:
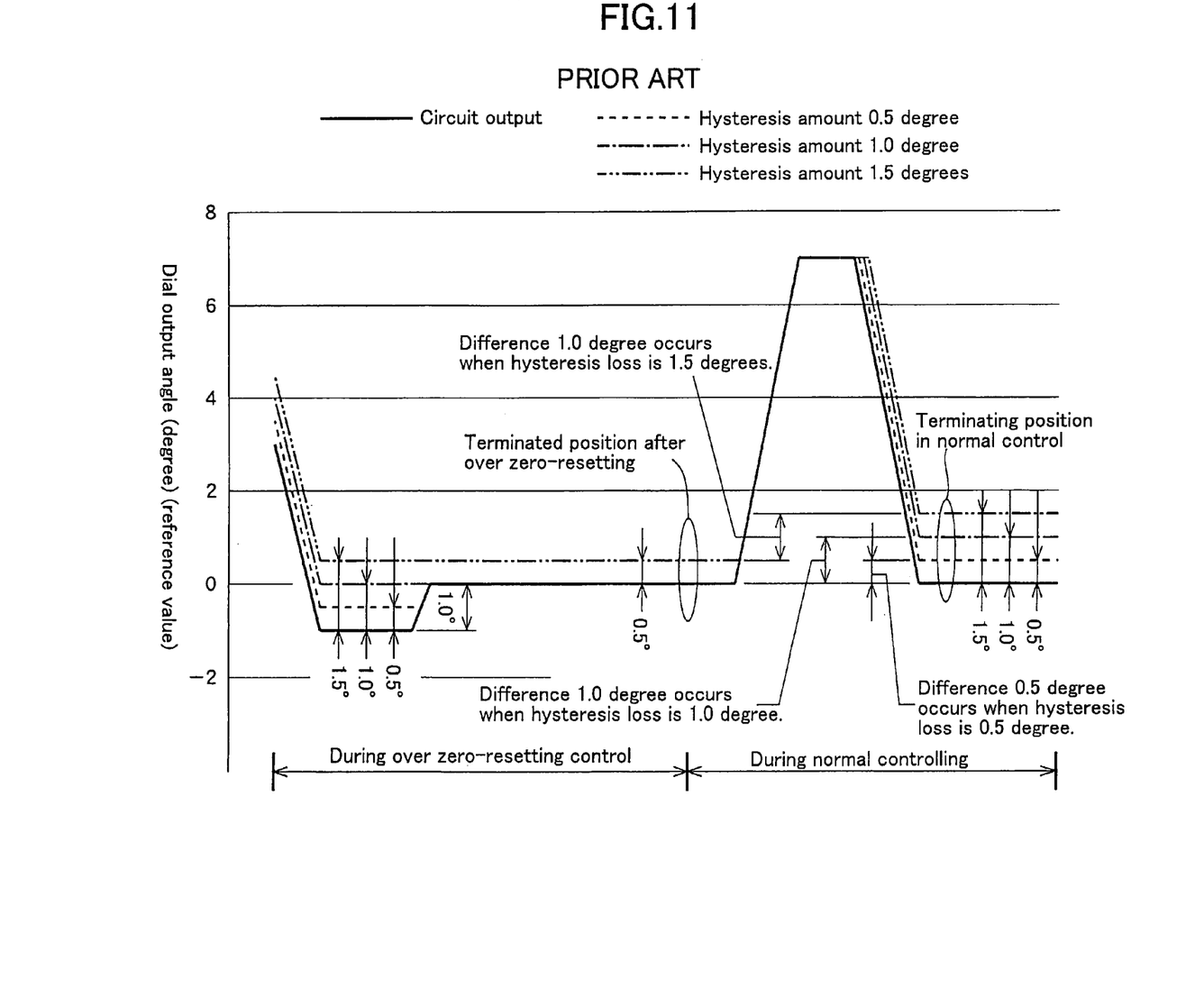
FIG. 11 is a diagram showing the movement of the indicating needle of the conventional indicating instrument.

FIG. 11 is a diagram showing the motion of the indicating needle of the conventional indicating instrument. In the conventional initialization processing, the position where the indicating needle 4 is normally turned from the position of the stopper in the normally turning (turned up) direction by one degree is taken as the stopped position of the indicating needle after the over zero-reset operation. The terminated position after the termination of the over zero-resetting differs from the terminated position of the indicating needle in the ordinary control due to the hysteresis loss. If the hysteresis loss is 1.5 degrees, a difference of 1.0 degrees occurs. If the hysteresis loss is 1.0 degree, a difference of 1.0 degree occurs. If the hysteresis loss is 0.5 degrees, a difference of 0.5 degree occurs.

In the present embodiment, the location of the stopper is judged based on the induction voltage. The present invention may be applied to a construction which does not judge the position of the stopper. In this case, the indicating needle is made to reach the position of the stopper by feeding AC zero-resetting signals larger than the maximum graduation angle. Further, after the indicating needle is turned upwardly beyond the position of the graduation "0" by feeding the AC zero-leaving signals, the AC zero-resetting signals are fed to return the indicating needle to the position of the graduation "0".

What is claimed is:

1. An indicating instrument comprising a stepping motor, a speed-reducing gear mechanism, an indicating needle to be turned by transmission of a rotary output of the stepping motor to the indicating needle via the speed-reducing gear mechanism, a stopper mechanism to mechanically stop turning of the indicating needle, and an initializing unit, wherein a position which the indicating needle indicates when the indicating needle is turned by a preset angle relative to a position which the indicating needle indicates when turning of the indicating needle is mechanically stopped with the stopper mechanism is taken as a graduation-starting position and wherein said initializing unit is configured to drive the stepping motor in such a direction that the indicating needle may turn toward the position where turning of the indicating needle is mechanically stopped with the stopper mechanism; after the turning of the indicating needle is mechanically stopped with the stopper mechanism, to drive the stepping motor in such a direction that the indicating needle may turn away from the place where the turning of the indicating needle is mechanically stopped with the stopper mechanism, thereby to turn the indicating needle beyond the graduation-starting position, and thereafter to drive the stepping motor in such a direction that the indicating needle may turn toward the stopper mechanism; and to return the indicating needle to the graduation-starting position and stop the indicating needle there.

2. The indicating instrument set forth in claim 1, wherein after the indicating needle is mechanically stopped with the stopper mechanism, the initializing unit effects an over zero-resetting operation to remove an influence due to a backlash.

3. The indicating instrument set forth in claim 1, which is a speed meter for a vehicle.

4. The indicating instrument set forth in claim 3, which comprises a CPU unit and an induction voltage-detecting circuit, said CPU unit is configured to drive the stepping motor based on a detection output of a vehicle speed sensor when an ignition switch is turned on and to turn the indicating needle to a graduated position corresponding to the vehicle speed, said CPU unit comprises a vehicle speed indication control unit, a PWM signal generating unit, a PWM signal outputting unit and said initializing unit, and the initializing unit comprises an output port-opening control unit to control one end of a coil of the stepping motor to an opened state and a stopper position-judging unit detects that the rotation of the magnet rotor is stopped based on an output from the induction voltage-detecting circuit, and thereby judges that the indicating needle is returned to the stopper position.

5. A initialization-driving device for initializing an indicating position of an indicating needle of an indicating instrument, said indicating instrument comprising a stepping motor, a speed-reducing gear mechanism, said indicating needle to be turned by transmission of a rotary output of the stepping motor to the indicating needle via the speed-reducing gear mechanism, and a stopper mechanism to mechanically stop turning of the indicating needle, wherein a position which the indicating needle indicates when the indicating needle is turned by a preset angle relative to a position which the indicating needle indicates when turning of the indicating needle is mechanically stopped with the stopper mechanism is taken as a graduation-starting position, said initializing device being configured to initializing the indicating position of the indicating needle by (1) driving the stepping motor in such a direction that a turning direction of the indicating needle which is to be turned via the speed-reducing gear mechanism while interlocking with a rotary motion of the stepping motor may turn toward a position where turning of the indicating needle is mechanically stopped with the stopper mechanism; after the turning of the indicating needle is mechanically stopped with the stopper mechanism, (2) driving the stepping motor in such a direction that the indicating needle may turn, by a first angle, away from the place where the turning of the indicating needle is mechanically stopped with the stopper mechanism, thereby to turn the indicating needle beyond the graduation-starting position, and thereafter (3) driving the stepping motor in such a direction that the indicating needle may turn, by a second angle smaller than the first one, toward the position where the turning of the indicating needle is mechanically stopped with the stopper mechanism.

6. The initialization-driving device set forth in claim 5, wherein after the indicating needle is mechanically stopped with the stopper mechanism, the initializing unit effects an over zero-resetting operation to remove an influence due to a backlash.

7. The indicating instrument set forth in claim 5, which is a speed meter for a vehicle.

8. The initialization-driving device set forth in claim 7, which comprises a PWM signal generating unit, a PWM signal outputting unit and an initializing unit, and the initializing unit comprises an output port-opening control unit to control one end of a coil of the stepping motor to an opened state and a stopper position-judging unit detects that the rotation of the magnet rotor is stopped based on an output from an induction voltage-detecting circuit, and thereby judges that the indicating needle is returned to the stopper position.

* * * * *

UNITED STATES PATENT AND TRADEMARK OFFICE
CERTIFICATE OF CORRECTION

PATENT NO. : 7,231,838 B2  
APPLICATION NO. : 11/208887  
DATED : June 19, 2007  
INVENTOR(S) : Sasaki et al.

Page 1 of 1

It is certified that error appears in the above-identified patent and that said Letters Patent is hereby corrected as shown below:

On the cover page,

[*] Notice: Subject to any disclaimer, the term of this patent is extended or adjusted under 35 USC 154(b) by (134) days Delete the phrase "by 134 days" and insert -- by 126 days--

Signed and Sealed this

Ninth Day of October, 2007

JON W. DUDAS  
*Director of the United States Patent and Trademark Office*